(12) United States Patent
Okada et al.

(10) Patent No.: US 7,303,845 B2
(45) Date of Patent: Dec. 4, 2007

(54) METHOD AND SYSTEM FOR EFFICIENTLY VERIFYING OPTICAL PROXIMITY CORRECTION

(75) Inventors: Tomoyuki Okada, Kawasaki (JP);
Masahiko Minemura, Kawasaki (JP);
Mitsuo Sakurai, Kawasaki (JP); Ryo Tsujimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 297 days.

(21) Appl. No.: 11/075,321

(22) Filed: Mar. 9, 2005

(65) Prior Publication Data

US 2005/0166112 A1  Jul. 28, 2005

Related U.S. Application Data

(63) Continuation of application No. PCT/JP03/05523, filed on Apr. 30, 2003.

(51) Int. Cl.
*G03F 9/00* (2006.01)
*G06F 17/50* (2006.01)

(52) U.S. Cl. .............................. 430/30; 430/5; 716/19; 716/21

(58) Field of Classification Search .................... 430/5, 430/30; 716/19–21
See application file for complete search history.

(56) References Cited

U.S. PATENT DOCUMENTS

| 2002/0040468 A1 | 4/2002 | Uno et al. |
| 2002/0066069 A1 | 5/2002 | Ashida et al. |

FOREIGN PATENT DOCUMENTS

| EP | 1 199 651 | 10/2001 |
| JP | 8-160598 | 6/1996 |
| JP | 2000-155408 | 6/2000 |
| JP | 2002-107908 | 4/2002 |
| JP | 1199651 | 4/2002 |
| JP | 2002-278041 | 9/2002 |
| JP | 2002-341512 | 11/2002 |

*Primary Examiner*—Christopher G. Young
(74) *Attorney, Agent, or Firm*—Staas & Halsey LLP (57) ABSTRACT

A method of verifying optical proximity correction includes the steps of generating first mask pattern data from design data under first condition, generating first corrected pattern data by applying optical proximity correction to the first mask pattern data, generating second mask pattern data from the design data under second condition, generating second corrected pattern data by applying optical proximity correction to the second mask pattern data, and comparing the first corrected pattern data and the second corrected pattern data to check whether the first corrected pattern data and the second corrected pattern data match.

10 Claims, 8 Drawing Sheets

METHOD AND SYSTEM FOR EFFICIENTLY VERIFYING OPTICAL PROXIMITY CORRECTION

CROSS-REFERENCE TO RELATED APPLICATION

This is a continuation of International Application No. PCT/JP2003/005523, filed on Apr. 30, 2003, the entire contents of which are hereby incorporated by reference.

BACKGROUND OF THE INVENTION

1. Field of the Invention

The present invention generally relates to methods, programs, and systems for verifying mask pattern data processes when generating mask patterns, and particularly relates to a method, program, and system for verifying an optical proximity correction process.

2. Description of the Related Art

In manufacturing of semiconductor devices, the pattern shape of a mask pattern is printed on a wafer by use of an optical transfer apparatus. As the miniaturization of semiconductor devices is further advanced, adjacent patterns may come in contact with each other because of an optical proximity effect. Further, corners of patterns may be rounded, and lines may become thinner and severed. By estimating such pattern deformation, the pattern data is processed such as to cancel or mitigate the deformation, thereby performing a correction process for ensuring that desired pattern shape is properly formed on the wafer. This is referred to as an optical proximity correction process.

The optical proximity correction process generates an aid pattern for mask pattern data in order to attain a desired wafer-transfer image by correcting the pattern on the reticle. Conventional pattern correction methods set rules with respect to the patters for correcting design data, and generate an aid pattern for reticle pattern data based on the rules for generating corrected patterns.

In order to check the pattern correction process as to whether it is satisfactory or unsatisfactory, a corrected pattern is generated for a simple predetermined test pattern. Visual inspection of this corrected pattern may then be carried out to see whether a desired pattern has been obtained. When the data is complex and its size is massive as in the case of an actual product, it is practically impossible to conduct visual inspection of the corrected pattern. Even when tools are used for verification, the results may not match each other, resulting in a large number of discrepancies, which makes the verification difficult.

[Patent Document 1] Japanese Patent Application Publication 2002-107908

Accordingly, there is a need for a verification method that can efficiently check whether optical proximity correction is properly working during the process of generating mask pattern data.

SUMMARY OF THE INVENTION

It is a general object of the present invention to provide a verification method that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by verification method particularly pointed out in the specification in such full, clear, concise, and exact terms as to enable a person having ordinary skill in the art to practice the invention.

To achieve these and other advantages in accordance with the purpose of the invention, the invention provides a method of verifying optical proximity correction, which includes the steps of generating first mask pattern data from design data under first condition, generating first corrected pattern data by applying optical proximity correction to the first mask pattern data, generating second mask pattern data from the design data under second condition, generating second corrected pattern data by applying optical proximity correction to the second mask pattern data, and comparing the first corrected pattern data and the second corrected pattern data to check whether the first corrected pattern data and the second corrected pattern data match.

According to the method described above, if a match between the two data items is found based on the check as to whether the two data items match, it is ascertained that the optical proximity correction is free from errors in terms of handling and processing of figures, and that a proper correction process is being performed. If there is a mismatch between the two data items, on the other hand, the optical proximity correction is modified to provide for appropriate optical proximity correction.

Further, the present invention provides a memory medium having a program embodied therein for causing a computer to perform the steps of the above-noted method of verifying optical proximity correction, and also provide a system that performs the method of verifying optical proximity correction.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

The present invention applies optical proximity correction to the first mask pattern data obtained from design data, thereby generating first corrected pattern data. Optical proximity correction is further applied to the second mask pattern data that is obtained from the same design data under different conditions, thereby generating second corrected pattern data. The first corrected pattern data and the second corrected pattern data are compared to check whether they match. If the comparison finds that these patterns match, then, it is properly ascertained that the optical proximity correction process is free from errors in terms of handling and processing of figures, and that a proper correction process is being performed.

A specific example of generating the second corrected pattern data under different conditions may be a method that rotates first mask pattern data a predetermined angle to generate second mask pattern data, and applies optical proximity correction to the second mask pattern data, followed by rotating the second mask pattern data in the reverse direction to place it back at the original angle, thereby obtaining the second corrected pattern data. Another specific example may be a method that is used in a case where mask pattern data is divided and represented as data comprised of a plurality of fields. This method divides the mask pattern data into a plurality of fields at positions different from those used for generating the first mask pattern data, thereby generating second mask pattern data. As a method of shifting the dividing positions, the direction in which division is made may be changed, or the width of a process grid may be changed to modify the pitches of division. Positions at which division is made may also be shifted.

Figure 1:
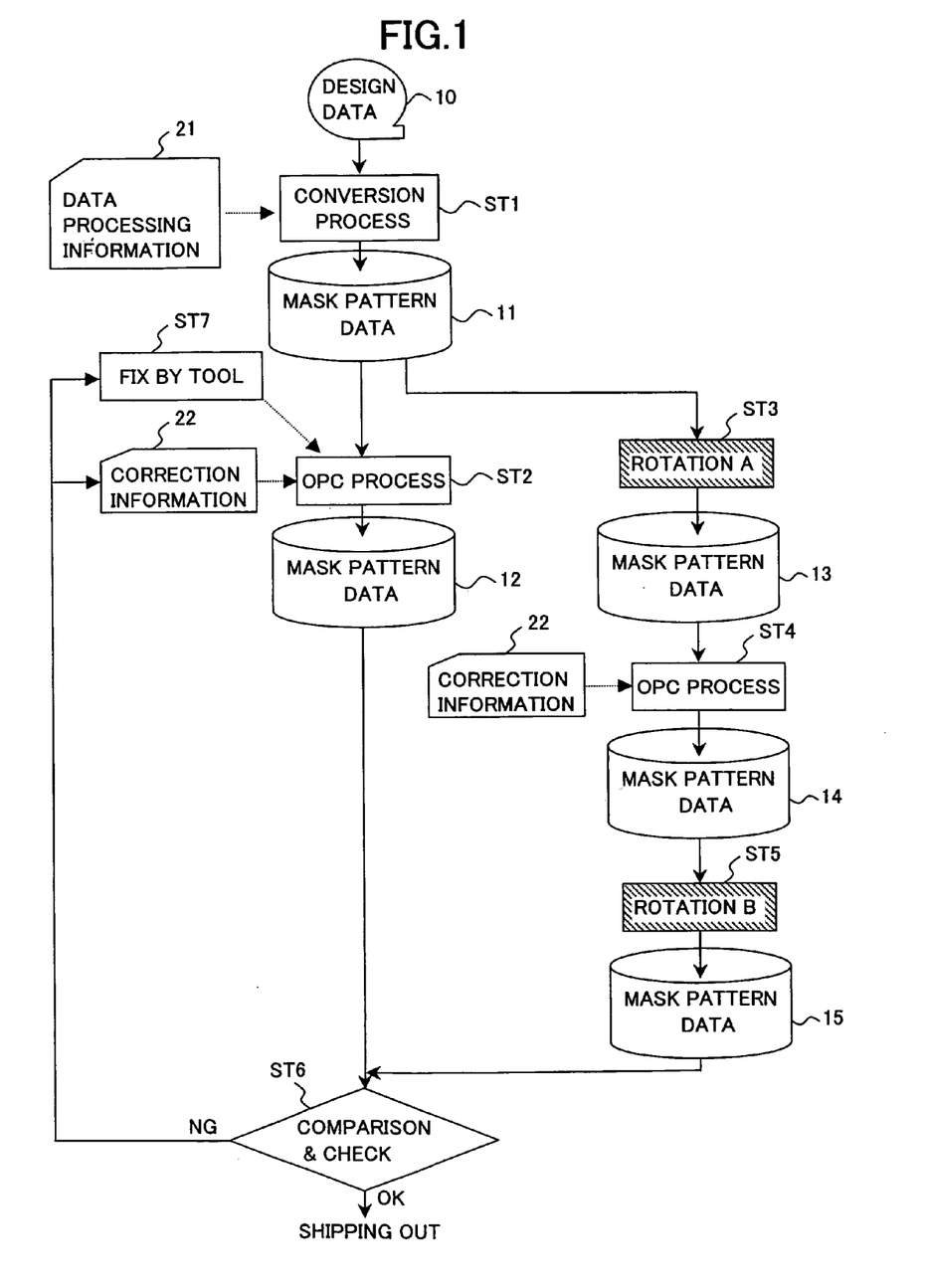
FIG. 1 is a flowchart showing a process of checking the properness of optical proximity correction by generating corrected pattern data through changes of angles.

FIG. 1 is a flowchart showing a process of checking the properness of optical proximity correction by generating corrected pattern data through changes of angles.

At step ST1 of FIG. 1, design data 10 is converted into mask pattern data 11. In doing so, data processing information 21 is referred to, thereby performing the conversion under conditions specified in this information. The data processing information 21 includes layer information about pattern layers, top-fig information about the uppermost layer pattern, sizing information about the size of patterns, divided area information about the areas by which a pattern is divided into a plurality of fields.

At step ST2, optical proximity correction is applied to the mask pattern data 11, thereby generating corrected mask pattern data (first corrected pattern data) 12. In so doing, correction information 22 is referred to, thereby applying optical proximity correction under conditions specified in this information. The correction information 22 defines rules of optical proximity correction.

In the optical proximity correction described above, the mask pattern data is recognized as a geometrical polygon figure. Based on such recognition, processes such as searching for pattern width and space, determination of correction values, and generation of a corrected figure are performed. Most of these processes are carried out by manipulating the coordinates of the vertexes of the figure. The manipulation of vertexes is generally performed for the X coordinate and for the Y coordinate separately. Each side of the figure is classified into the horizontal direction, vertical direction, and diagonal direction according to predetermined rules, and is manipulated separately. When a single rectangle is to be corrected, for example, the four sides are recognized as four vectors extending counterclockwise, and the X coordinates and Y coordinates of the vectors parallel to each other are modified.

At step ST3, the mask pattern data 11 is subjected to rotation A, thereby generating mask pattern data 13.

At step ST4, optical proximity correction is applied to the mask pattern data 13 to generate corrected mask pattern data (corrected pattern data) 14. In so doing, the correction information 22 is referred to, thereby performing optical proximity correction under conditions specified in this information. The correction information 22 defines rules of optical proximity. correction, and is the same as the correction information 22 used at step ST2.

At step ST5, the mask pattern data (corrected pattern data) 14 is subjected to rotation B, thereby generating mask pattern data (second corrected pattern data) 15. Compared with the rotation A, the rotation B rotates the pattern data the same angle in the reverse direction. Accordingly, the mask pattern data (second corrected pattern data) 15 is placed at the same angle as the mask pattern data 11.

At step ST6, the mask pattern data (first corrected pattern data) 12 and the mask pattern data (second corrected pattern data) 15 are compared with each other through data comparison by the computer to check whether these data items match. If the comparison finds that these data items match each other, the mask pattern data 12 is ascertained to be proper data, which is usable for the creation of a mask. If the comparison finds that these data items do not match, the optical proximity correction is ascertained to be inappropriate. Since it is found that there is a problem with the optical proximity correction, the optical proximity correction is fixed by use of predetermined tools at step ST7.

Figure 2:
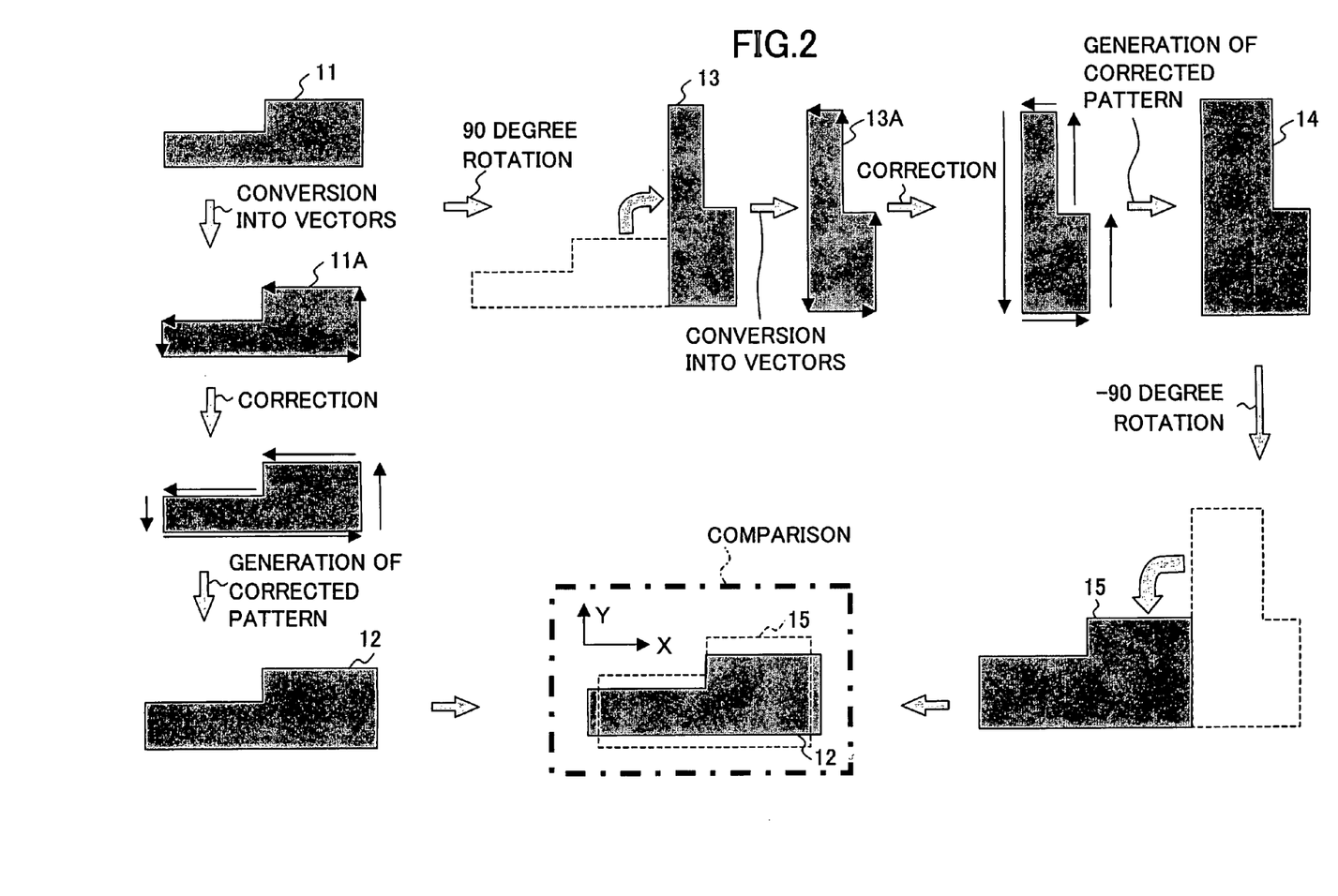
FIG. 2 is a drawing for explaining a verification process in the case of rotation.

FIG. 2 is a drawing for explaining a verification process in the case of rotation. FIG. 2 illustrates a case in which a rotation angle is 90 degrees.

Starting from the top left corner in FIG. 2 and moving counterclockwise, the mask pattern data 11 is turned into vectors, thereby generating vector data 11A. Correction process is applied to the vector data 11A evenly with respect to the X direction and with respect to the Y direction so as to generate corrected data. The mask pattern data (first corrected pattern data) 12 is thus obtained.

Starting from the top left corner in FIG. 2 and moving clockwise, the mask pattern data 11 is rotated 90 degrees to generate the mask pattern data 13. The mask pattern data 13 is then turned into vectors to generate vector data 13A. Correction process is applied to the vector data 13A evenly with respect to the X direction and with respect to the Y direction so as to generate corrected data. The mask pattern data (corrected pattern data) 14 is thus obtained. Further, the mask pattern data (corrected pattern data) 14 is rotated by −90 degrees to generate the mask pattern data (second corrected pattern data) 15.

Lastly, the mask pattern data (first corrected pattern data) 12 and the mask pattern data (second corrected pattern data) 15 are compared with each other to check whether they match, thereby verifying the optical proximity correction. In the example shown in FIG. 2, correction in the Y direction has a problem, for example. Despite the fact that correction is applied evenly with respect to the X direction and with respect to the Y direction, therefore, correction is not sufficient in the Y direction. As a result, the mask pattern data (first corrected pattern data) 12 is shorter in the Y direction than properly corrected size, and the mask pattern data (second corrected pattern data) 15 is shorter in the X direction than properly corrected size. In this manner, the comparison of corrected pattern data makes it possible to find that the correction process has a problem with respect to the Y direction.

Figure 3:
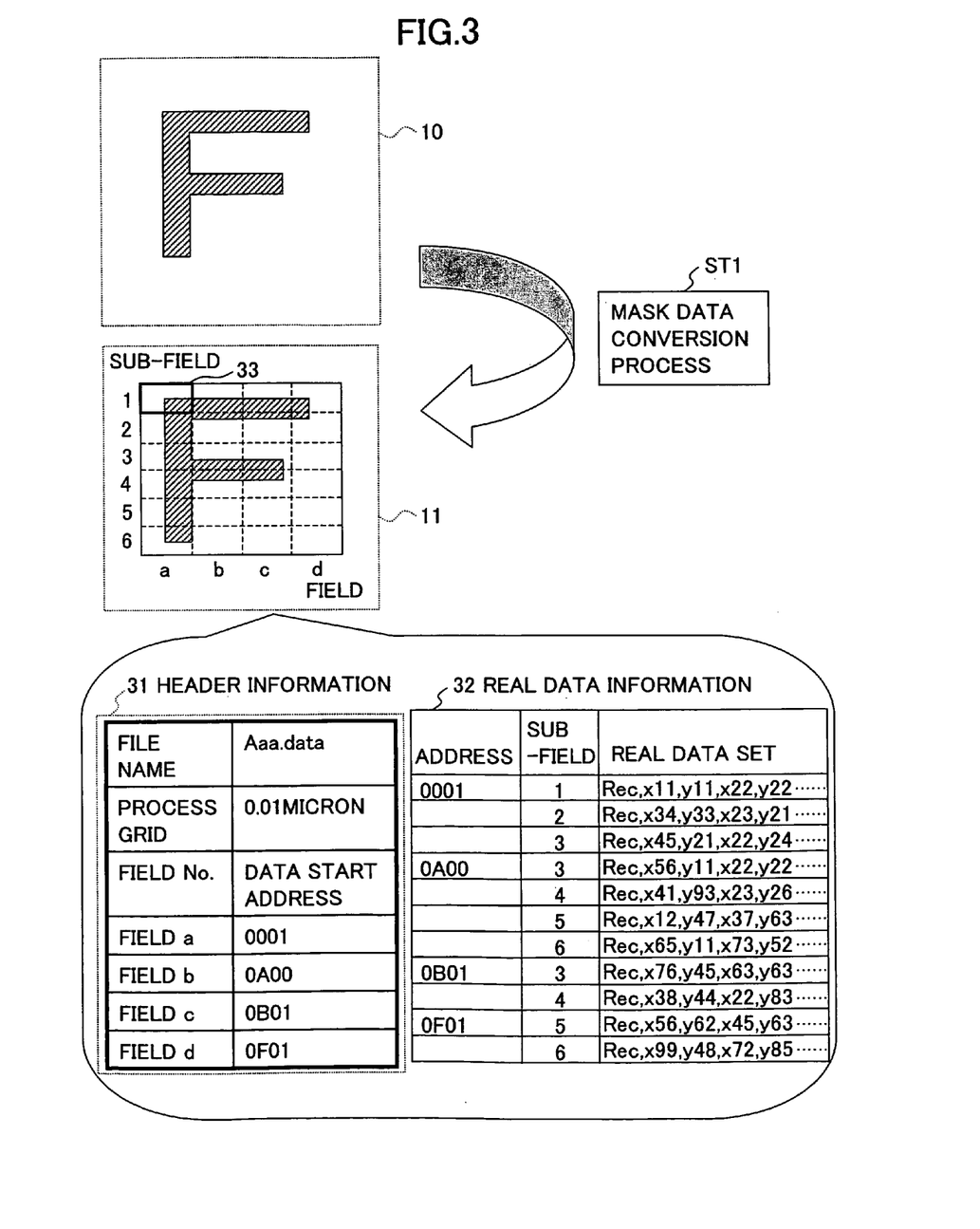
FIG. 3 is a drawing showing an example of the data structure of mask pattern data.

FIG. 3 is a drawing showing an example of the data structure of mask pattern data.

As shown in FIG. 3, the design data 10 is subjected to mask data conversion (i.e., the process of ST1 in FIG. 1). This generates the mask pattern data 11. It should be noted that the design data 10 and the mask pattern data 11 illustrated in FIG. 3 are not data themselves, but are the visualized images of the mask pattern. The mask pattern data 11 is divided into four fields FIELDa through FIELDd, and is divided into six sub-fields SUB-FIELD1 through SUB-FIELD6.

At the bottom of FIG. 3, an example of the data structure of the mask pattern data 11 is illustrated as header information 31 and real data information 32. The header information 31 is a header, only one of which is provided for a single item of the mask pattern data 11. The header information 31 indicates the file name of the data file, the size of a process grid, and the start address of each field. In the example of FIG. 3, the file name of the data file is "Aaa.data", and the size of a process grid "0.01 micron". Further, the start addresses of FIELDa through FIELDd are "0001", "0A00", "0B01", and "0F01", respectively.

The real data information 32 stores the mask pattern data corresponding to the individual sub-fields of a given field, starting from the start address of this given field as indicated in the header information 31. For example, the start address of FIELDa is "0001". Starting from the address "0001", therefore, the mask pattern data of the SUB-FIELD1 of FIELDa, the mask pattern data of the SUB-FIELD2 of FIELDa, the mask pattern data of the SUB-FIELD3 of FIELDa, and so on are stored. The mask pattern data of the SUB-FIELD1 of FIELDa, for example, corresponds to the mask pattern data contained in a divided area 33 located at the top left corner of the visualized image of the mask pattern data 11 shown in FIG. 3.

Figure 4:
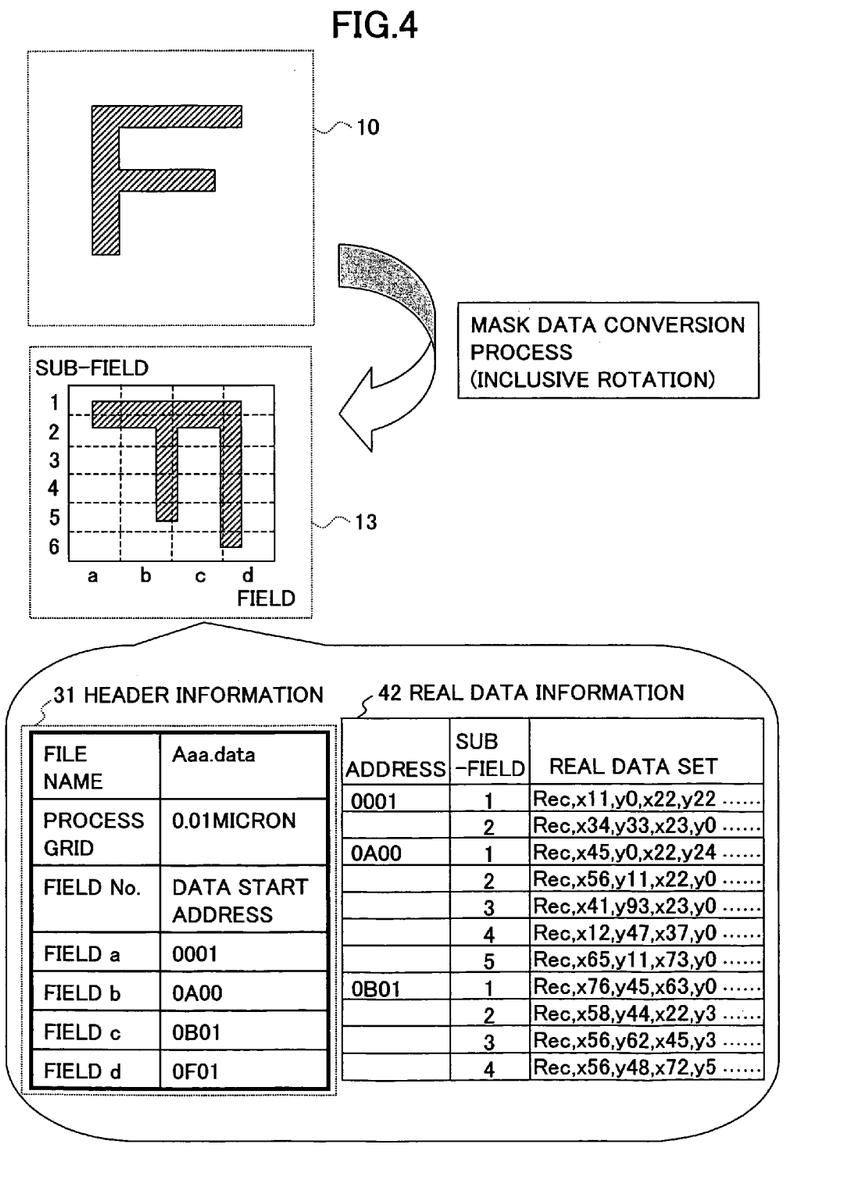
FIG. 4 is a drawing showing an example of the data structure of mask pattern data in a case where mask pattern data is rotated.

FIG. 4 is a drawing showing an example of the data structure of mask pattern data in a case where mask pattern data is rotated.

As shown in FIG. 4, the design data 10 is subjected to mask pattern data conversion (inclusive of rotation), thereby generating the mask pattern data 13. In the examples of FIG. 1 and FIG. 2, the mask pattern data 13 is generated from the mask pattern data 11. As shown in FIG. 4, the mask pattern data 13 as rotated may be generated directly from the design data 10. The mask pattern data 13 is divided by the four fields FIELDa through FIELDd and the six sub-fields SUB-FIELD1 through SUB-FIELD6.

The header information 31 of the mask pattern data 13 is the same as the header information 31 shown in FIG. 3. On the other hand, real data information 42 has data contents completely different from those of the real data information 32 shown in FIG. 3. This is because the mask pattern data 13 is rotated 90 degrees relative to the mask pattern data 11, so that the mask pattern data contained in each sub-field completely differs between the mask pattern data 11 and the mask pattern data 13.

Through such rotation process, it is possible to obtain the mask pattern data 11 and the mask pattern data 13 that are completely different from each other as far as data contents are concerned, despite the fact that the substance as a mask is the same. The mask pattern data 11 and the mask pattern data 13 are subjected to optical proximity correction, thereby detecting an error in the optical proximity correction, as previously described.

Figure 5:
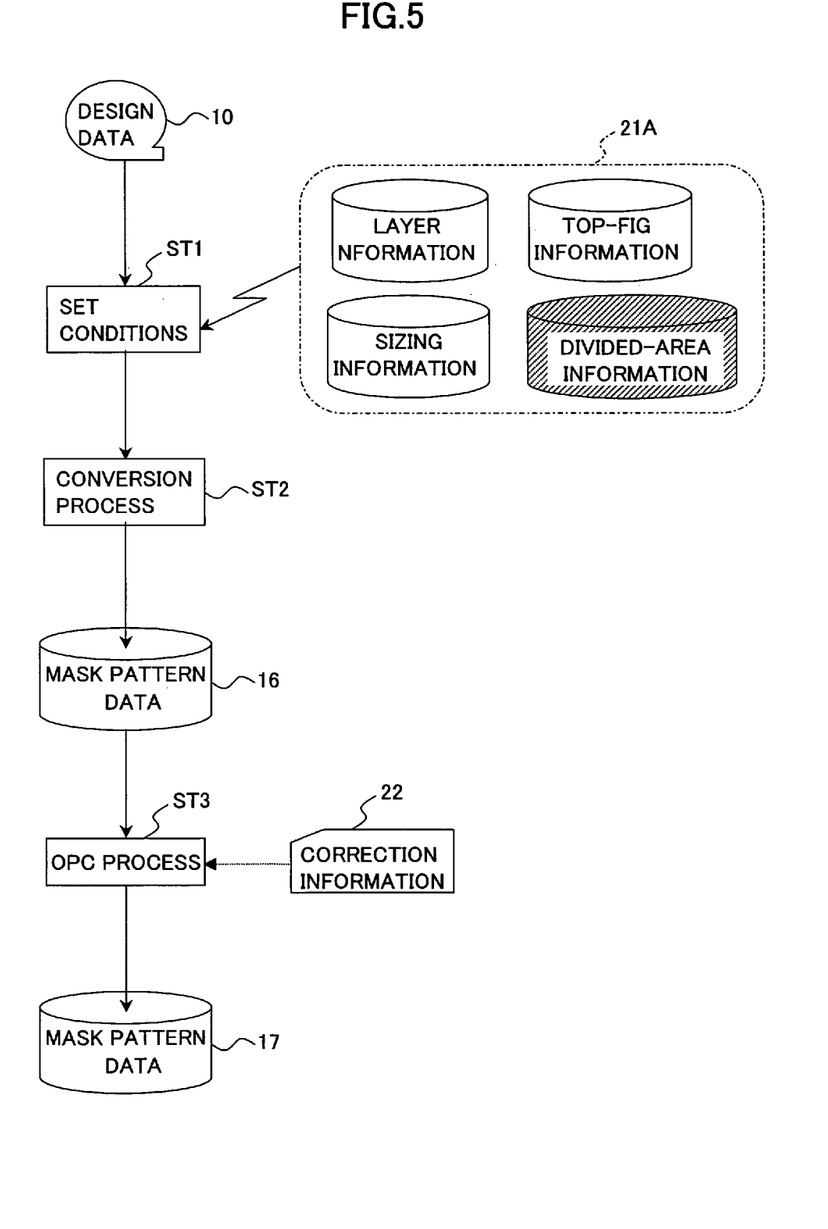
FIG. 5 is a flowchart of a process of checking the properness of optical proximity correction by generating corrected pattern data by changing the position of division.

FIG. 5 is a flowchart of a process of checking the properness of optical proximity correction by generating corrected pattern data by changing the position of division. FIG. 5 shows a portion corresponding to the generation of the mask pattern data (first corrected pattern data) 12 as shown in FIG. 1 and the comparison-purpose mask pattern data (second corrected pattern data).

At step ST1, conversion conditions are selected based on data processing information 21A. The data processing information 21A includes layer information about pattern layers, top-fig information about the uppermost layer pattern, sizing information about the size of patterns, divided area information about the areas by which a pattern is divided into a plurality of fields. In the process shown in FIG. 5, mask pattern data is generated by use of area divisions different from those for the mask pattern data 11 shown in FIG. 1. Because of this, the divided area information of the data processing information 21A has different settings than the divided area information of the data processing information 21 of FIG. 1.

At step ST2, the design data 10 is converted into mask pattern data 16. The mask pattern data 16 is the same as the mask pattern data 11 of FIG. 1 as far as the substance as a mask is concerned. Since the way the fields and sub-fields are arranged through division are different, these two data items differ from each other completely as data contents are concerned.

At step ST4, optical proximity correction is applied to the mask pattern data 16 to generate corrected mask pattern data (second corrected pattern data) 17. In so doing, the correction information 22 is referred to, thereby performing optical proximity correction under conditions specified in this information. The correction information 22 defines rules of optical proximity correction, and is the same as the correction information 22 used at step ST2 of FIG. 1.

The mask pattern data (second corrected pattern data) 17 obtained in this manner is compared with the mask pattern data (first corrected pattern data) 12 of FIG. 1 through data comparison by the computer, thereby checking whether they match. If the comparison finds that these two data items match, the mask pattern data 12 is regarded as proper data, which is usable for mask generation. If the comparison finds that these two data items do not match, it is ascertained that the mask pattern data 12 is not proper, and that the optical proximity correction has a problem. In this case, predetermined tools are used to fix the optical proximity correction.

Figure 6:
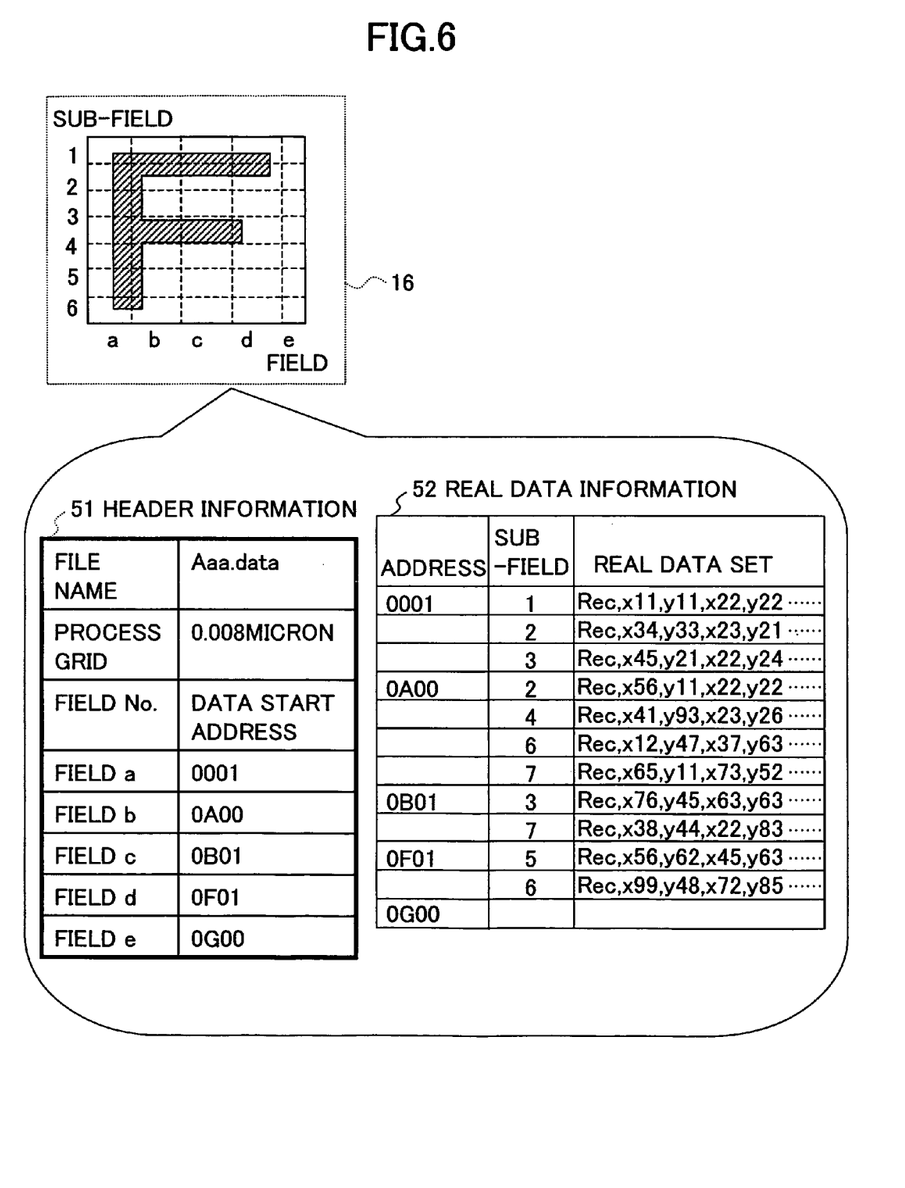
FIG. 6 is a drawing showing an example of the data structure of mask pattern data in a case where the way the mask pattern data is divided into areas is changed.

FIG. 6 is a drawing showing an example of the data structure of mask pattern data in a case where the way the mask pattern data is divided into areas is changed.

In FIG. 6, the mask pattern data 16 is divided by five fields FIELDa through FIELDe and seven sub-fields SUB-FIELD1 through SUB-FIELD7. Compared with the mask pattern data 11 shown in FIG. 3, the number of fields and the number of sub-fields are increased by 1, respectively. This is because the pitches of fields and sub-fields are set shorter, so that the position of division differs between the mask pattern data 11 of FIG. 3 and the mask pattern data 16 of FIG. 6.

Header information 51 of the mask pattern data 16 differs from the header information 31 shown in FIG. 3. The interval of a process grid is set to 0.008 micron, which is shorter than 0.01 micron shown in the example of FIG. 3. This provides shorter pitches for the fields and sub-fields. As a result, the field FIELDe is added as a fifth field.

Real data information 52 is inevitably different from the real data information 32 of FIG. 3 as far as the data contents are concerned. This is because the pitches of fields and sub-fields are different between the mask pattern data 11 and the mask pattern data 16, and so are the positions where division is made.

Through such process that shifts the positions where division is made, it is possible to obtain the mask pattern data 11 and the mask pattern data 16 that are completely different from each other as far as data contents are concerned, despite the fact that the substance as a mask is the same. The mask pattern data 11 and the mask pattern data 16 are subjected to optical proximity correction, thereby detecting an error in the optical proximity correction, in the same manner as previously described.

The above description has been given by treating rotation and a change in the position of division as separate, independent embodiments. Alternatively, rotation and a change in the position of division may be integrated and performed together. In the following, a description will be given of such an embodiment.

Figure 7:
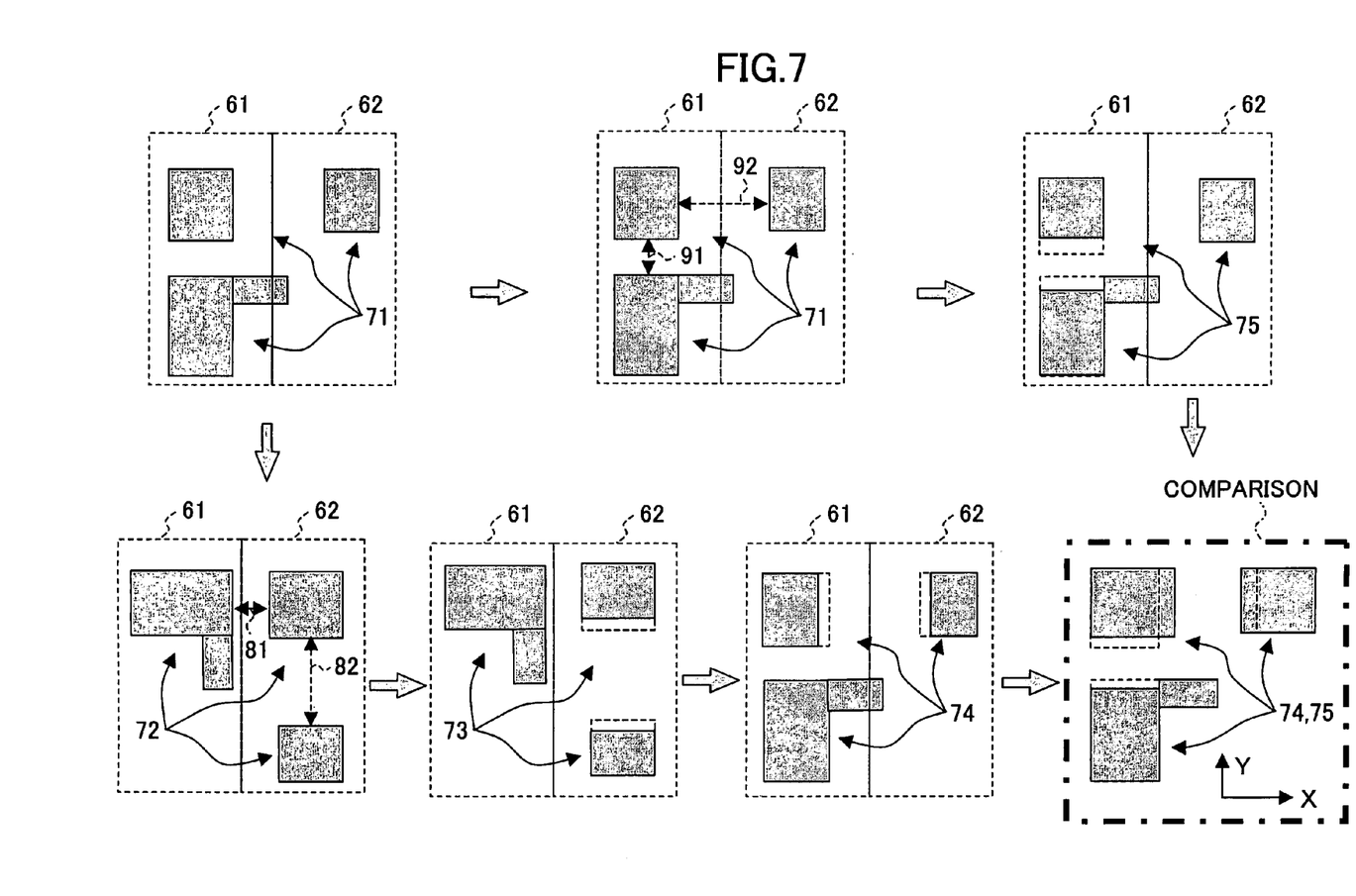
FIG. 7 is a drawing for explaining a verification process in a case in which rotation and a change in the position of division are integrated.

FIG. 7 is a drawing for explaining a verification process in a case in which rotation and a change in the position of division are integrated.

As shown at the top left corner of FIG. 7, two fields 61 and 62 are provided for mask pattern data 71. In the current state, the mask pattern data 71 is not divided into the fields 61 and 62. The fields 61 and 62 are illustrated here for the sake of convenience of explanation, and are simply the divided areas having no substance that are superimposed for illustration on the position of the mask pattern data 71.

Starting from the top left corner and tracing the arrows counterclockwise, the mask pattern data 71 is first rotated 90 degrees to generate mask pattern data 72. The mask pattern data 72 is then divided by the fields 61 and 62, and is represented as the data of the individual fields. Further, spaces 81 and 82 between the individual items of the mask pattern data 72 are identified. Taking these spaces into account, optical proximity correction is applied, thereby obtaining corrected mask pattern data 73. The corrected mask pattern data 73 is then rotated −90 degrees, which generates mask pattern data (first corrected pattern data) 74.

Starting from the top left corner of FIG. 7 and tracing the arrows clockwise, the mask pattern data 71 is first divided by the fields 61 and 62, and is represented as the data of the individual fields. As can be seen from the drawing, the position where the mask pattern data 71 is divided into the fields 61 and 62 is different from the position where the mask pattern data 72 as rotated 90 degrees is divided into the fields 61 and 62 as described above. This is because the mask pattern data is rotated relative to the fields 61 and 62. With respect to the mask pattern data 71 obtained in this manner, spaces 91 and 92 between the individual elements are identified. By taking these spaces into account, optical proximity correction is applied, thereby generating mask pattern data (second corrected pattern data) 75.

Lastly, the mask pattern data (first corrected pattern data) 74 and the mask pattern data (second corrected pattern data) 75 are compared with each other to check whether they match. This serves to verify the optical proximity correction. When the mask pattern data is divided into the fields 61 and 62 as shown in this example, it is necessary to recognize the presence of patterns close to the boundaries of the fields when optical proximity correction is applied. Since the patterns of the individual fields are treated as separate data on a field-by-field basis, it is likely to have a problem in that patterns are not properly recognized through program errors near the boundaries. In the example described above, the mask pattern data is rotated 90 degrees relative to the fields 61 and 62 so as to change the way the pattern is divided, thereby making it possible to detect such errors.

Figure 8:
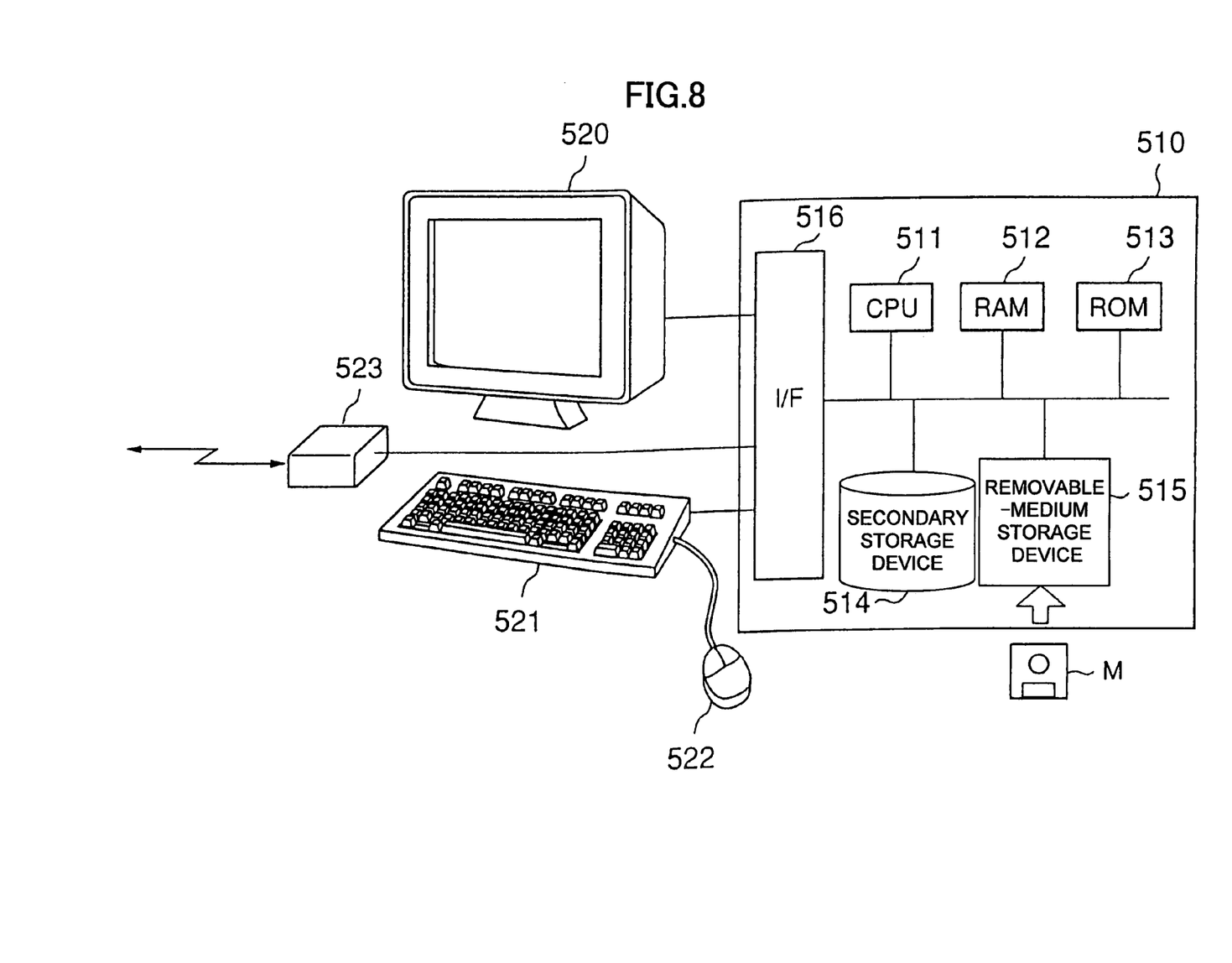
FIG. 8 is a drawing showing the construction of an apparatus for performing a method of verifying optical proximity correction according to the present invention.

FIG. 8 is a drawing showing the construction of an apparatus for performing a method of verifying optical proximity correction according to the present invention.

As shown in FIG. 8, the apparatus for performing a method of verifying optical proximity correction according to the present invention is implemented as a computer such as a personal computer or an engineering workstation. The apparatus shown in FIG. 8 includes a computer 510, a display apparatus 520 connected to the computer 510, a communication apparatus 523, and an input apparatus. The input apparatus includes a keyboard 521 and a mouse 522. The computer 510 includes a CPU 511, a RAM 512, a ROM 513, a secondary storage device 514 such as a hard disk, a removable-medium storage device 515, and an interface 516.

The keyboard 521 and mouse 522 provide user interface, and receive various commands for operating the computer 510 and user responses responding to data requests or the like. The display apparatus 520 displays the results of processing by the computer 510, and further displays various data that makes it possible for the user to communicate with the computer 510. The communication apparatus 523 provides for communication with a remote cite, and may be comprised of a modem, network interface, or the like.

The method of verifying optical proximity correction according to the present invention is provided as a computer program executable by the computer 510. This computer program is stored in a memory medium M that is mountable to the removable-medium storage device 515. The computer program is loaded to the RAM 512 or the secondary storage device 514 from the memory medium M through the removable-medium storage device 515. Alternatively, the computer program may be stored in a remote memory medium (not shown), and is loaded to the RAM 512 or the secondary storage device 514 from the remote memory medium through the communication apparatus 523 and the interface 516.

Upon user instruction for program execution entered through the keyboard 521 and/or the mouse 522, the CPU 511 loads the program to the RAM 512 from the memory medium M, the remote memory medium, or the secondary storage device 514. The CPU 511 executes the program loaded to the RAM 512 by use of a free space of the RAM 512 as a work area, and continues processing while communicating with the user as a need arises. The ROM 513 stores therein control programs for the purpose of controlling basic operations of the computer 510.

Execution of the computer program makes it possible to perform the method of verifying optical proximity correction as described in the above embodiments. The computer environment for the execution of the method of verifying optical proximity correction is the optical proximity correction verifying system or optical proximity correction verifying apparatus.

Further, the present invention is not limited to these embodiments, but various variations and modifications may be made without departing from the scope of the present invention.

What is claimed is:

1. A method of verifying optical proximity correction, comprising:
    generating first mask pattern data from design data under a first condition;

generating first corrected pattern data by applying an optical proximity correction, specified by predetermined correction rules, to the first mask pattern data;

generating second mask pattern data from said design data under a second condition;

generating second corrected pattern data by applying an optical proximity correction, specified by correction rules the same as the predetermined correction rules, to the second mask pattern data; and comparing the first corrected pattern data and the second corrected pattern data to check whether the first corrected pattern data and the second corrected pattern data match.

2. The method as claimed in claim 1, further comprising modifying the optical proximity correction in response to a mismatch between the first corrected pattern data and the second corrected pattern data.

3. The method as claimed in claim 1, wherein the step generating first mask pattern data generates the first mask pattern data without rotating the design data, and the generating second mask pattern data generates the second mask pattern data by rotating the design data by a predetermined angle in a predetermined direction, and wherein the generating second corrected pattern data generates the second corrected pattern data by rotating the second mask pattern data by the predetermined angle in a direction opposite the predetermined direction after the optical proximity correction is applied to the second mask pattern data.

4. The method as claimed in claim 3, wherein the predetermined angle is an integer multiple of 90 degrees.

5. The method as claimed in claim 1, wherein the generating first mask pattern data generates the first mask pattern data by dividing the design data into first predetermined areas, and the generating second mask pattern data generates the second mask pattern data by dividing the design data into second predetermined areas different from the first predetermined areas.

6. The method as claimed in claim 1, wherein the generating first mask pattern data defines the first predetermined areas by a first process grid, and the generating second mask pattern data defines the second predetermined areas by a second process grid different from the first process grid.

7. The method as claimed in claim 1, wherein the generating first mask pattern data generates the first mask pattern data by dividing the design data into predetermined areas without rotating the design data, and the generating second mask pattern data generates the second mask pattern data by rotating the design data by a predetermined angle in a predetermined direction and by dividing the rotated design data into the predetermined areas, and wherein the generating second corrected pattern data generates the second corrected pattern data by rotating the second mask pattern data by the predetermined angle in a direction opposite the predetermined direction after the optical proximity correction is applied to the second mask pattern data.

8. The method as claimed in claim 7, wherein the predetermined angle is an integer multiple of 90 degrees.

9. A record medium having a program embodied therein for reading by a computer and causing the computer to verify optical proximity correction, by:

generating first mask pattern data from design data under a first condition;

generating first corrected pattern data by applying an optical proximity correction, specified by predetermined correction rules, to the first mask pattern data;

generating second mask pattern data from said design data under a second condition;

generating second corrected pattern data by applying an optical proximity correction, specified by correction rules the same as the predetermined correction rules, to the second mask pattern data; and comparing the first corrected pattern data and the second corrected pattern data to check whether the first corrected pattern data and the second corrected pattern data match.

10. A system for verifying optical proximity correction, comprising:

a unit configured to generate first mask pattern data from design data under a first condition;

a unit configured to generate first corrected pattern data by applying an optical proximity correction, specified by predetermined correction rules, to the first mask pattern data;

a unit configured to generate second mask pattern data from said design data under a second condition;

a unit configured to generate second corrected pattern data by applying an optical proximity correction, specified by correction rules the same as the predetermined correction rules to the second mask pattern data; and a unit configured to compare the first corrected pattern data and the second corrected pattern data to check whether the first corrected pattern data and the second corrected pattern data match.

\* \* \* \* \*

UNITED STATES PATENT AND TRADEMARK OFFICE
CERTIFICATE OF CORRECTION

PATENT NO. : 7,303,845 B2 Page 1 of 1
APPLICATION NO. : 11/075321
DATED : December 4, 2007
INVENTOR(S) : Tomoyuki Okada et al.

It is certified that error appears in the above-identified patent and that said Letters Patent is hereby corrected as shown below:

Column 9, Line 18, after "wherein the" delete "step".

Column 10, Line 40, after "rules" and before "the", insert --,--.

Signed and Sealed this

First Day of July, 2008

JON W. DUDAS
*Director of the United States Patent and Trademark Office*